(12) United States Patent
Iwai et al.

(10) Patent No.: US 6,551,444 B2
(45) Date of Patent: Apr. 22, 2003

(54) PLASMA PROCESSING APPARATUS AND METHOD OF PROCESSING

(75) Inventors: Tetsuhiro Iwai, Fukuoka (JP); Ryota Furukawa, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/118,244

(22) Filed: Apr. 9, 2002

(65) Prior Publication Data
US 2002/0148561 A1 Oct. 17, 2002

(30) Foreign Application Priority Data
Apr. 12, 2001 (JP) ......................................... 2001-113691

(51) Int. Cl.[7] ............................................... H01L 21/00
(52) U.S. Cl. .............................. 156/345.26; 156/345.33; 156/345.43
(58) Field of Search ........................ 156/345.33, 345.24, 156/345.26, 345.43; 118/723 R, 723 E

(56) References Cited

U.S. PATENT DOCUMENTS

| 5,823,416 | A |   | 10/1998 | Haji |
| 5,951,772 | A | * | 9/1999 | Matsuse et al. ......... 118/723 R |
| 5,972,163 | A |   | 10/1999 | Haji |
| 6,093,904 | A |   | 7/2000 | Haji |
| 6,239,036 | B1 |  | 5/2001 | Arita et al. |
| 6,313,583 | B1 |  | 11/2001 | Arita et al. |

* cited by examiner

Primary Examiner—Thi Dang
(74) Attorney, Agent, or Firm—Wenderoth, Lind & Ponack, L.L.P.

(57) ABSTRACT

A plasma processing apparatus and a method of plasma processing using the same obviate a problem in which an excessive amount of processing gas is supplied momentarily during an initial stage of the gas supply. In the process of supplying gas, a main controller outputs to a mass flow controller a flow-rate setting command signal preset for "zero flow" prior to opening a gas shut-off valve, which opens/closes a gas supply passage, and another flow-rate setting command signal set for "a specific flow rate" only after the gas shut-off valve is opened.

8 Claims, 4 Drawing Sheets

PLASMA PROCESSING APPARATUS AND METHOD OF PROCESSING

FIELD OF THE INVENTION

The present invention relates to a plasma processing apparatus for carrying out plasma processing on work objects such as substrates and the like.

BACKGROUND OF THE INVENTION

Plasma processing is commonly known as a method of surface treatment like cleaning and etching of work objects such as substrates and the like on which electronic components are mounted. To accomplish a desired surface treatment, a method of plasma processing includes:

(A) placing a substrate to be processed in a vacuum chamber constituting a processing chamber;

(B) supplying processing gas into the processing chamber after the chamber has been evacuated to a vacuum state;

(C) generating plasma within the processing chamber maintained under a predetermined pressure; and (D) bombarding a surface of the substrate with generated ions and/or electrons to finish the surface treatment of the substrate.

A gas importing unit for delivering the processing gas requires a gas flow-rate regulating function in order cause a predetermined amount of the processing gas to flow continuously, and a commercially available mass flow controller is used generally for this purpose.

A mass flow controller comprises:

(a) a flow control valve with an adjustable orifice in a gas passage;

(b) a flow rate detector for detecting a flow rate in the gas passage; and (c) a feedback controller for comparing a fed-back result of detected flow rate with a previously directed flow-rate setting command signal, and for adjusting the orifice of the flow control valve so as to maintain a predetermined flow rate. The flow-rate setting command signal is prescribed according to an amount of gas supply necessary for the plasma processing.

With the plasma processing apparatus of the prior art equipped with a mass flow controller of the above-described structure, however, there has been a problem in the gas supply during the plasma processing.

That is, in the past, the mass flow controller has been provided with a prescribed flow-rate setting command signal as described above, when supplying the gas into the processing chamber of which an interior is evacuated to a vacuum state. As the flow rate is set, an upstream gas shutoff valve is opened, and the processing gas is delivered toward the mass flow controller from a gas supply source such as a gas cylinder or the like.

The feedback controller regulates the flow control valve in a manner to expand the orifice in an attempt to increase a flow rate of the gas to a flow rate closer to the prescribed flow rate, since the flow rate of the gas at the flow rate detector of the mass flow controller is zero before the gas shut-off valve is opened. When the gas shut-off valve is opened under this condition, an excessive amount, or well over an appropriate amount of the processing gas actually needed, is supplied into the processing chamber, because the gas is supplied with the flow control valve open excessively. This results in a substantial increase in pressure of the processing chamber, thereby requiring a long period of gas evacuation in order to bring the pressure in the processing chamber to a proper level for starting the plasma discharge. In other words, it needlessly increases a time from a beginning of the vacuum evacuation to the start of plasma discharge, and causes a delay of cycle time.

SUMMARY OF THE INVENTION

The present invention is to provide a plasma processing apparatus as well as a method of plasma processing that can shorten a time required for vacuum evacuation and improve productivity.

The plasma processing apparatus of this invention is intended to carry out plasma processing on a work object, and it comprises:

a processing chamber for enclosing the work object to be processed and for carrying out plasma processing;

evacuation means for evacuating an interior of the processing chamber to a vacuum state;

a gas importing unit for supplying processing gas to the processing chamber through a gas supply passage, the gas importing unit comprising a gas shut-off valve for opening and/or closing the gas supply passage to be connected to a supply source of the processing gas, a flow rate detector for detecting a flow rate of the processing gas in the gas supply passage, a flow control valve disposed in the gas supply passage, and provided with an adjustable orifice opening, and a main controller for outputting a flow-rate setting command signal, and controlling opening and/or closing of the gas shut-off valve;

a plasma generator for generating plasma in the interior of the processing chamber; and wherein a feedback controller is operably coupled to the flow control valve and the flow rate detector for controlling the orifice of the flow control valve according to the flow-rate setting command signal, and according to a result of the flow rate detected by the flow rate detector.

Also, a method of plasma processing of this invention employs the above-said plasma processing device, and it includes a gas supply step for producing an output of a flow-rate setting command signal, for setting a flow rate to zero, prior to opening the gas shut-off valve, and another flow-rate setting command signal for setting a predetermined flow rate only after the gas shut-off valve is opened.

DETAILED DESCRIPTION OF THE PREFERRED EMBODIMENT

An exemplary embodiment of the present invention will now be described with reference to FIG. 1 through FIG. 4.

Figure 1:
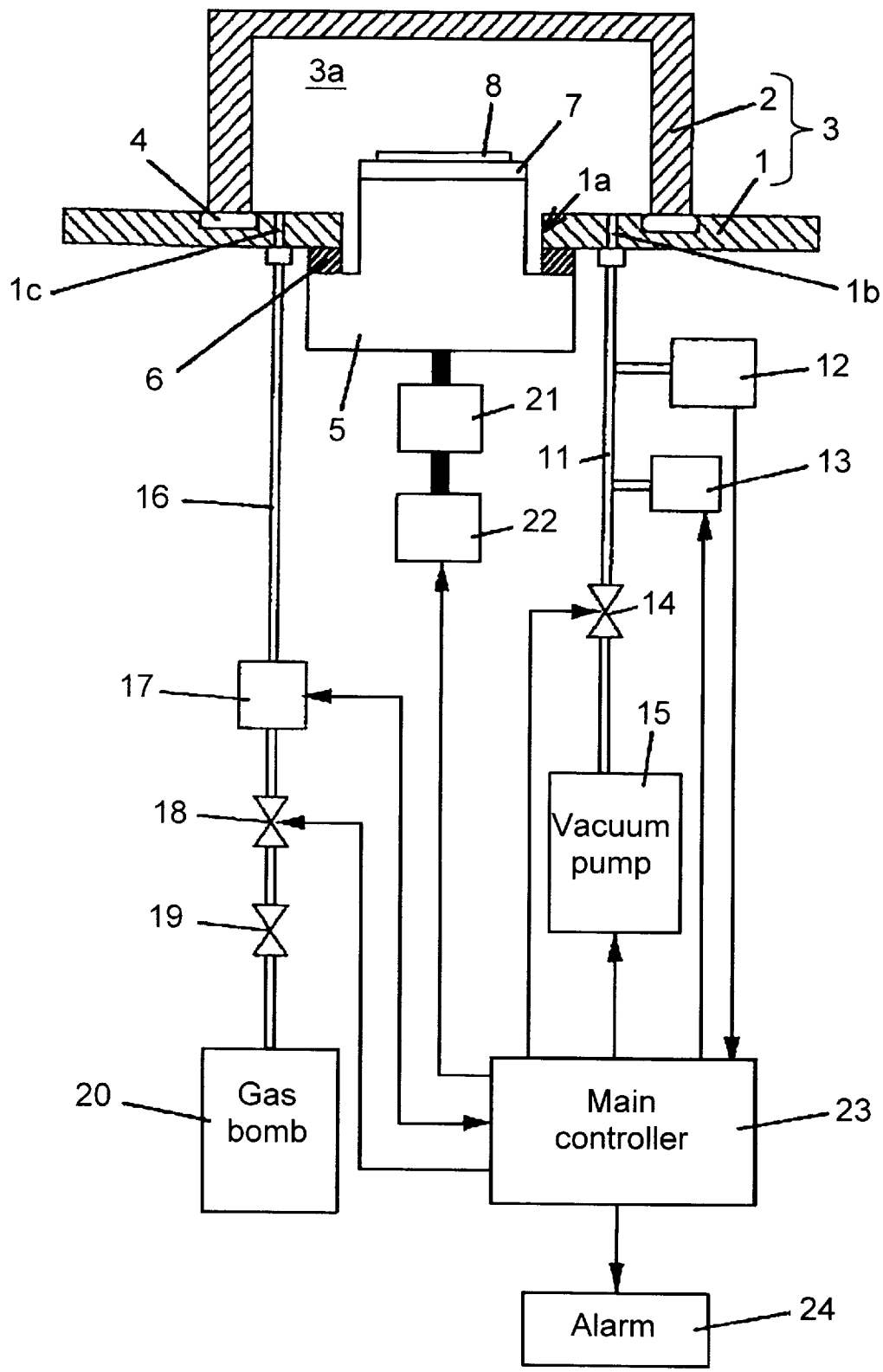
FIG. 1 is a sectional view depicting a plasma processing apparatus of an exemplary embodiment of the present invention.

Referring to FIG. 1, a structure of the plasma processing apparatus will be described first. In FIG. 1, vacuum chamber 3 is constructed of a cover 2 positioned on a horizontal base 1 such that the cover 2 can be vertically moved by an elevator. The elevator is not shown in these figures. The vacuum chamber 3 is closed when the cover 2 comes down and abuts upon an upper surface of the base 1 via a sealing member 4. A hermetically sealed space enclosed by the base 1 and the cover 2 constitutes a processing chamber 3a for containing the work object to be processed and for carrying out the plasma processing. The base 1 has an opening 1a, to which an electrode 5 is mounted from the underside via an insulating member 6. The electrode 5 has an upper surface for carrying a substrate 8 defining the work object to be processed. The substrate 8 is held in position on an insulator 7 which also serves as a guide member.

A vacuum gauge 12, a vent valve 13, and a vacuum valve 14 are connected to a hole 1b provided in the base 1 through a pipeline 11, and the vacuum valve 14 is connected with a vacuum pump 15 (vacuum evacuation means). The processing chamber 3a is evacuated to a vacuum state when the vacuum valve 14 is open while the vacuum pump 15 is kept running. A degree of vacuum in the processing chamber 3a is read with the vacuum gauge 12. The vent valve 13, when open, introduces air into the processing chamber 3a.

A hole 1c provided in the base 1 is a gas supply hole through which the processing gas (hereinafter referred to as "gas") is introduced into the processing chamber 3a. The gas is supplied by a gas importing unit. The gas importing unit has a pipeline 16, a mass flow controller 17, and a gas shut-off valve 18. The gas from a gas bomb 20 is decompressed by a pressure-reducing valve 19 to a suitable pressure, and delivered to the processing chamber 3a under the control of the gas importing unit.

The hole 1c is connected with the mass flow controller 17 through the pipeline 16, and the mass flow controller 17 is connected to the gas bomb 20 through the gas shut-off valve 18 and the pressure-reducing valve 19. The gas bomb 20 is a supply source of the processing gas such as argon gas, oxygen, or the like, and the gas supplied from the gas bomb 20 is decompressed to a predetermined pressure by the pressure-reducing valve 19. The gas shut-off valve 18 opens and/or closes the gas supply passage, so as to turn on and/or off a supply of the decompressed gas at the predetermined pressure.

Figure 2:
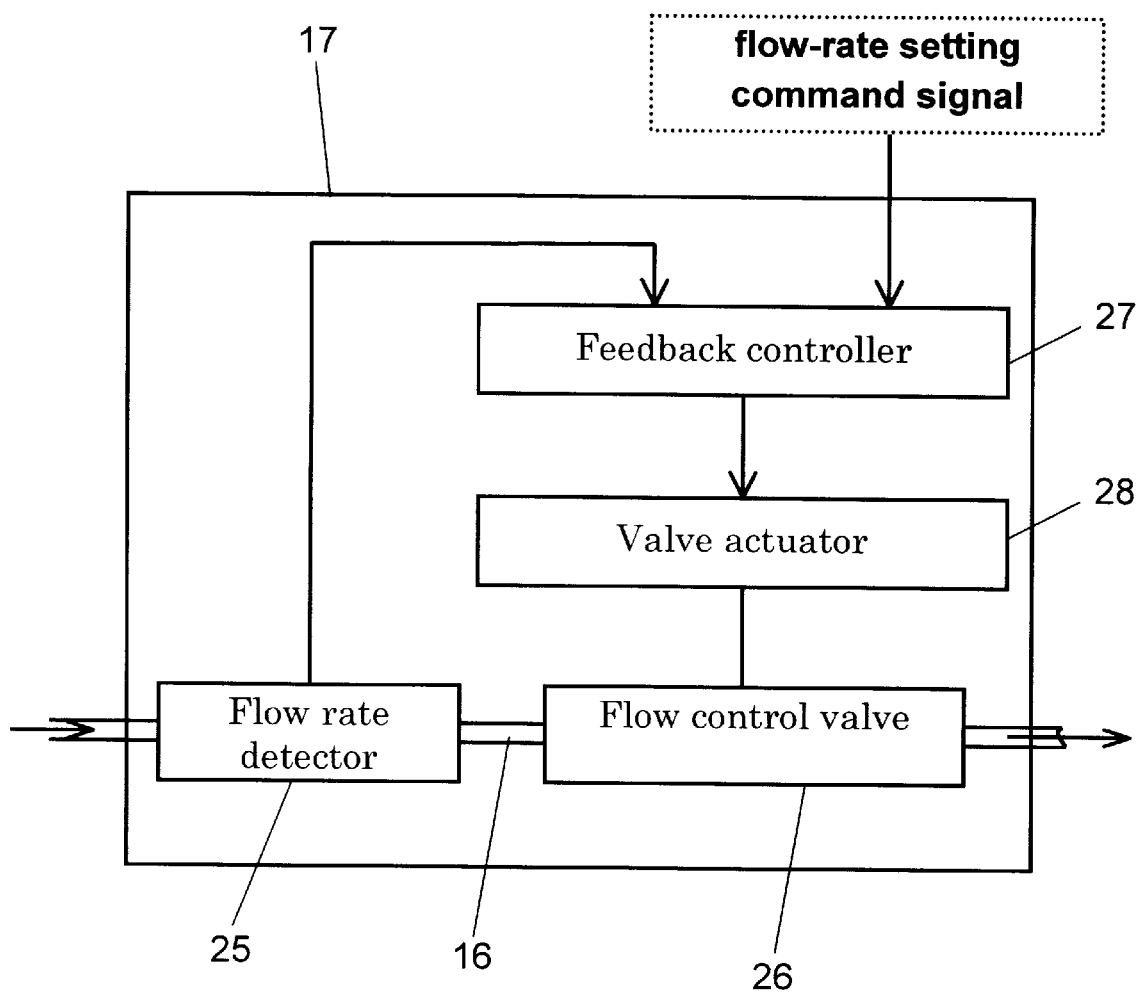
FIG. 2 is a block diagram of a mass flow controller of the plasma processing apparatus of the exemplary embodiment of the invention.

Referring now to FIG. 2, a structure and function of the mass flow controller 17 will be described. The mass flow controller 17 comprises a flow rate detector 25, a flow control valve 26, a feedback controller 27, and a valve actuator 28. The flow rate detector 25 reads a flow rate of the gas in the gas supply passage, as the gas is supplied via the gas shut-off valve 18. The flow control valve 26 is disposed in the gas supply passage, and it is a control valve having an adjustable orifice, wherein a flow rate of the gas supplied to an interior of the processing chamber 3a through the pipeline 16 can be regulated by adjusting this orifice.

The valve actuator 28 is for adjusting the orifice, i.e. valve opening, in the flow control valve 26. The feedback controller 27 controls the orifice opening of the flow control valve 26 by regulating the valve actuator 28 based on the flow-rate setting command signal and a detected result of flow rate provided by the flow rate detector 25. This feedback control regulates a flow rate of the gas supplied to the processing chamber 3a in a manner to agree at all times with the gas flow rate specified by the flow-rate setting command signal.

In FIG. 1, a high frequency power supply 22 is connected to the electrode 5 through a matching unit 21. By operating the high frequency power supply 22, a high frequency voltage is applied between the electrode 5 and the cover 2 functioning as the counter electrode. The matching unit 21 matches the impedance of the high frequency power supply 22 to that of a plasma discharge circuit, which generates plasma discharge in the interior of the processing chamber 3a. With the processing chamber 3a filled with the gas after vacuum evacuation, the high frequency voltage is applied between the electrode 5 and the cover 2 to generate plasma within the processing chamber 3a. In other words, the cover 2, the electrode 5, the matching unit 21, and the high frequency power supply 22 constitute a plasma generation means for generating plasma in the processing chamber 3a.

A control system will now be described. In FIG. 1, a main controller 23 controls the vent valve 13, the vacuum valve 14, the vacuum pump 15, the gas shut-off valve 18, and the high frequency power supply 22. In addition, the main controller 23 outputs to the mass flow controller 17 a flow-rate setting command signal according to conditions of the plasma processing.

Furthermore, the main controller 23 receives an indication of pressure in the processing chamber 3a measured by the vacuum gauge 12, and controls operation of the individual components during the plasma processing based on the measured pressure. It also outputs an abnormal pressure signal when a value of the measured pressure exceeds a preset upper pressure limit. Alarm unit 24 gives an alarm of prescribed form representing a malfunction or the like upon receipt of the abnormal pressure signal output by the main controller 23.

Figure 3:
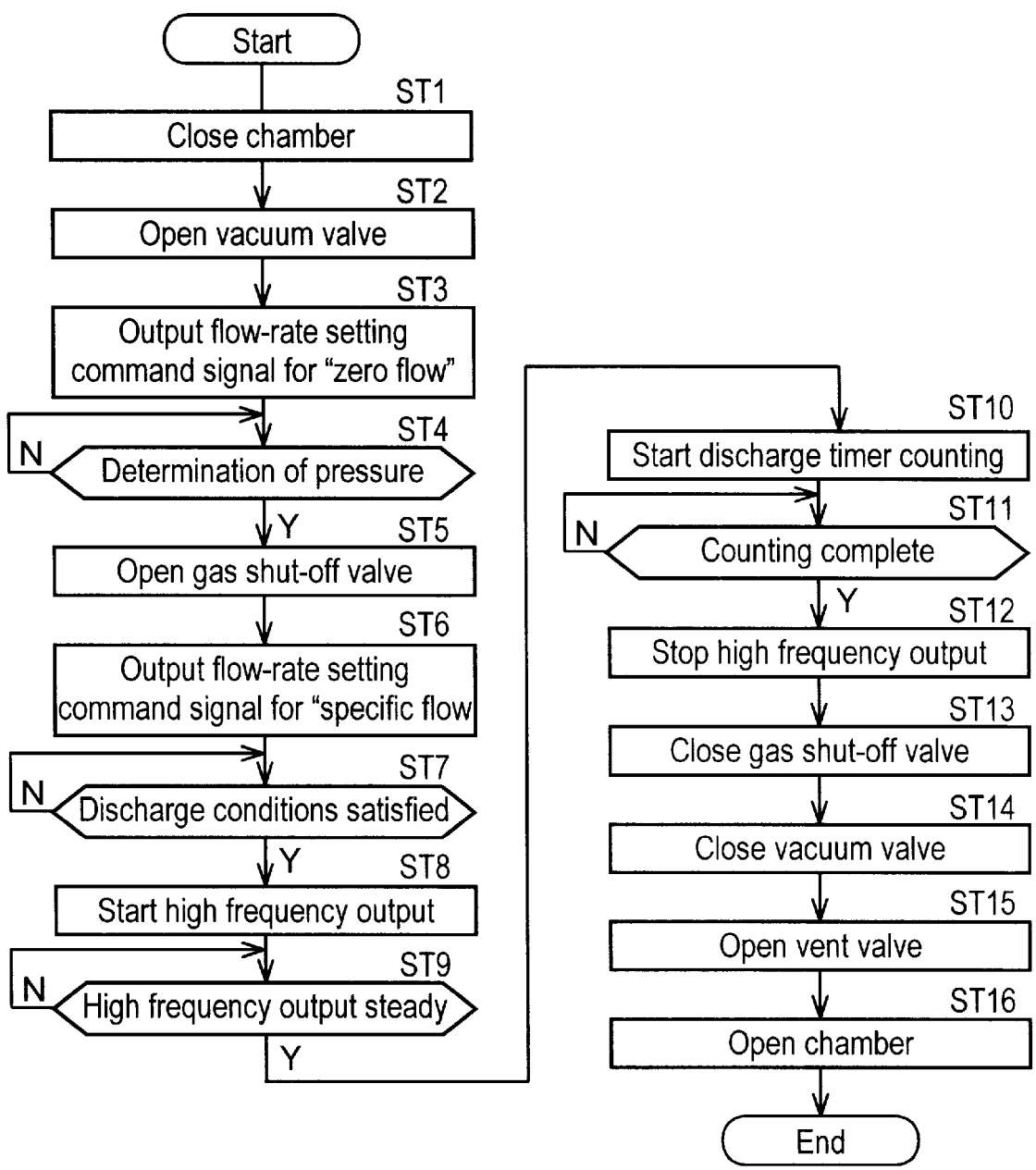
FIG. 3 is a flow chart showing a method of plasma processing of an exemplary embodiment of the invention.

A method of plasma processing using the above plasma processing apparatus will now be described with reference to the flow chart shown in FIG. 3. First, the cover 2 is lifted to open the vacuum chamber 3, and it is then closed after the substrate 8 is placed on the insulator 7 above the electrode 5, as indicated in FIG. 3 (ST1). The vacuum valve 14 is opened next (ST2). This starts a vacuum evacuation in the interior of the processing chamber 3a by the vacuum pump 15 which is kept operating at all times.

Under this condition, the main controller 23 outputs to the mass flow controller 17 a flow-rate setting command signal representing "zero flow" (ST3). In response to this command, the mass flow controller 17 controls the flow control valve 26 so that the orifice is closed (i.e. has a zero opening). The main controller 23 monitors the pressure measured by the vacuum gauge 12, and determines whether or not it has reached a prescribed starting pressure for the gas supply (ST4). The gas shut-off valve 18 is opened upon determination that the preset pressure is reached (ST5). Hence, the gas is supplied from the gas bomb 20 toward the mass flow controller 17.

Following the above, the main controller 23 outputs to the mass flow controller 17 another flow-rate setting command signal representing "a specific flow rate" determined according to conditions of the plasma processing (ST6). As a result, the flow control valve 26 is readjusted so as to be opened to an extent corresponding to the specified flow rate, and the gas is supplied into the processing chamber 3a at the specified flow rate. During this step of continuing the gas supply, determination is made as to whether the predetermined discharge conditions are satisfied, i.e., whether the gas flow is steadily maintained and a gas pressure in the processing chamber 3a is steady at the predetermined processing pressure (ST7).

Once the discharge conditions are met, the high frequency power supply 22 begins generating high frequency output power, and the high frequency voltage is applied on the electrode 5 (ST8). The matching unit 21 then determines whether the high frequency output power is stabilized, i.e., if the impedance matching is made with the plasma discharge circuit (ST9).

Once the high frequency output power is stabilized, a timer function built into the main controller 23 causes a discharge timer to start counting (ST10). That is, the counting begins for a processing time of the plasma processing carried out according to the preset process conditions. During the processing, the main controller 23 monitors an end of the counting by the discharge timer (ST11), and it causes the high frequency power supply 22 to turn off the high frequency output power when counting of a predetermined time ends (ST12). This ceases the plasma discharge in the processing chamber 3a.

Subsequently, the gas shut-off valve 18 is closed (ST13), and the vacuum valve 14 is also closed (ST14). The vent valve 13 is opened thereafter to introduce the air into the processing chamber 3a (ST15), and finally the vacuum chamber 3 is opened (ST16). The above steps complete one cycle of the plasma processing of this invention.

Figure 4:
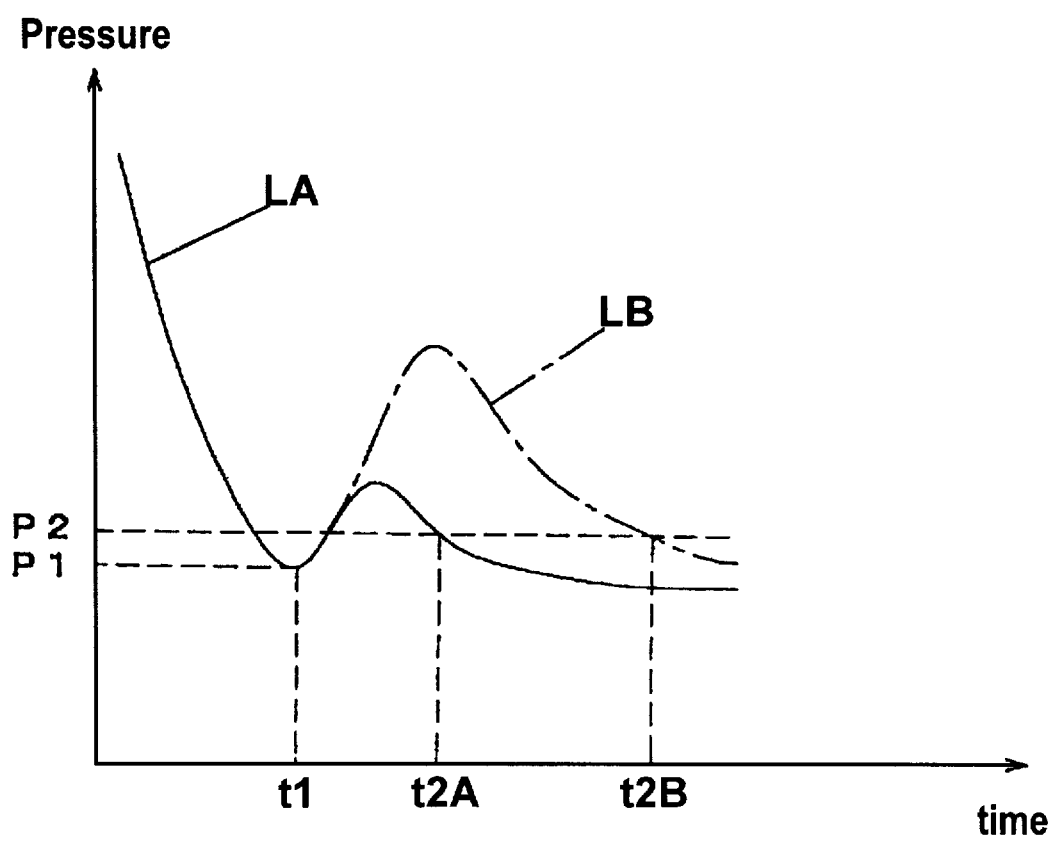
FIG. 4 is a graphic representation showing a change of pressure in an interior of a processing chamber for the plasma processing of the exemplary embodiment of this invention.

Referring next to FIG. 4, the following discussion pertains to a change of pressure in the interior of the processing chamber 3a during the vacuum evacuation process and the gas supply process according to the flow chart of the plasma processing discussed above. FIG. 4 shows a change of pressure in the processing chamber 3a after the start of vacuum evacuation. As shown with a curved line LA, pressure in the processing chamber 3a decreases rapidly after the start of vacuum evacuation. The gas supply begins at a time t1 when the gas supply starting pressure P1 is reached.

Although the gas supply to the processing chamber 3a begins in this step, the gas does not flow immediately into the processing chamber 3a because the orifice of the flow control valve 26 in the mass flow controller 17 is not opened at the moment the gas shut-off valve 18 is opened, since the mass flow controller 17 is provided with an output of the flow-rate setting command signal set for "zero flow" prior to opening the gas shut-off valve 18, as indicated in the flow chart.

In other words, the flow-rate setting command signal representing "a specific flow rate" is output only after the gas shut-off valve 18 is opened and the gas enters to flow in the mass flow controller 17. The gas starts flowing thereafter into the processing chamber 3a. During this stage, a flow rate of the gas entering the processing chamber 3a is regulated to the specified rate by the feedback control function of the mass flow controller 17.

As the gas supply begins, the pressure in the processing chamber 3a starts rising. However, the pressure inside the processing chamber 3a, although increased once, begins decreasing again because the vacuum evacuation is continued before and after the start of gas supply. And the high frequency voltage begins being output at a time t2A when the pressure reaches a value P2 corresponding to the condition for starting the electric discharge.

Another curved line LB shown in FIG. 4 represents a change of pressure in an instance that the gas flow rate is controlled using a mass flow controller of the prior art having a similar function, for the purpose of comparison with this exemplary embodiment. In the conventional process of gas supply, the mass flow controller 17 is not provided with any output of flow-rate setting command signal set for "zero flow", but only a flow-rate setting command signal corresponding to "a specific flow rate".

In the start of plasma processing, although the gas shut-off valve 18 is opened under the above condition, there occurs an excessive gas supply at the time the gas supply begins, as described hereinafter. That is, the flow rate detector 25 always detects a zero flow rate since the gas is not supplied to the mass flow controller 17 before the gas shut-off valve 18 is opened. Therefore, in the regulating operation of the orifice opening of the flow control valve 26, the feedback controller 27 controls the valve actuator 28 in a manner to increase the flow rate (or, in a manner to increase the orifice opening). As a result, the orifice of the flow control valve 26 is opened to the maximum degree.

Since the gas shut-off valve 18 is then opened under this condition, it causes the gas to flow at an excessively large flow rate into the processing chamber 3a at the moment when the gas supply begins. This results in a substantial increase of the pressure in the processing chamber 3a, as shown by the curved line LB of FIG. 4, and thereby it requires extra time, to the time t2B, until the interior pressure of the processing chamber 3a decreases to the electric discharge starting pressure P2 by the vacuum evacuation. This has been an obstacle to shortening the time required to complete a cycle of the plasma processing.

In the method of plasma processing illustrated in this exemplary embodiment, by contrast to the above, the main controller 23 operates in a manner to keep the flow control valve 26 closed at least at the moment when it opens the gas shut-off valve 18 from its closed position. In other words, the main controller 23 outputs the flow-rate setting command signal by setting it to "zero flow", to close the flow control valve 26. Accordingly, it resolves the above problem associated with the conventional method of gas supply, and shortens the time required for the vacuum evacuation, thereby improving the productivity by shortening the entire cycle time.

According to the present invention, a flow-rate setting command signal set for "zero flow" is output prior to opening the gas shut-off valve, and another flow-rate setting command signal set for "a specific flow rate" is output only after the gas shut-off valve is opened, in the gas supply process for introducing the processing gas into the processing chamber. Thus, an improvement of the productivity is realized by eliminating the phenomenon of an excessive amount of the processing gas being supplied momentarily in the initial stage of the feedback control of the gas flow rate, and shortening the time required for the vacuum evacuation.

What is claimed is:

1. A plasma processing apparatus for plasma processing of a work object, said plasma processing apparatus comprising:

a processing chamber;

a processing chamber evacuation unit operably coupled to said processing chamber;

a gas importing device for supplying processing gas into said processing chamber through a gas supply passage, said gas importing device including a gas shut-off valve for opening and closing the gas supply passage, a flow rate detector for detecting a flow rate of the processing gas in the gas supply passage, and a flow control valve, having an adjustable orifice, to be coupled to the gas supply passage;

a main controller for producing a flow-rate setting command signal, and controlling opening and closing of said gas shut-off valve;

a plasma generator for generating plasma in said processing chamber; and wherein a feedback controller is operably coupled to said flow control valve and said flow rate detector to control an opening of said adjustable orifice of said flow control valve according to said flow-rate setting command signal and according to the flow rate detected by said flow rate detector.

2. The plasma processing apparatus of claim 1, wherein said main controller is operable to keep said flow control valve closed when said gas shut-off valve is opened from a closed position.

3. The plasma processing apparatus of claim 2, wherein said main controller is operable to keep said flow control valve closed when said flow-rate setting command signal is preset for zero flow.

4. The plasma processing apparatus of claim 1, wherein said main controller is further operable to:

set the flow-rate setting command signal for zero flow;

determine whether or not a degree of vacuum in the interior of said processing chamber reaches a predetermined level;

direct a command to open said gas shut-off valve upon determination that the degree of vacuum has reached the predetermined level; and then set the flow-rate setting command signal for a specific flow rate.

5. The plasma processing apparatus of claim 1, wherein said main controller has a determination function including
a pressure determination function, and
an impedance matching determination function;

a signal output function including
a flow-rate setting command signal output function,
a valve opening/closing command signal output function, and
an abnormal pressure signal output function; and
a timer function.

6. The plasma processing apparatus of claim 1, wherein said feedback controller constitutes part of said gas importing unit.

7. A method of plasma processing using a plasma processing apparatus having a gas shut-off valve for opening and closing a gas supply passage, a flow rate detector for detecting a flow rate of processing gas in said gas supply passage, a flow control valve coupled to said gas supply passage, a main controller for outputting a flow-rate setting command signal and controlling opening and closing of said gas shut-off valve, and a feedback controller for controlling an orifice opening of said flow control valve according to said flow-rate setting command signal and according to the flow rate detected by said flow rate detector, said method comprising:

evacuating a processing chamber containing a work object to be processed;

supplying said processing gas into the evacuated processing chamber, said supplying of said processing gas comprising
setting the flow-rate setting command signal for zero flow while keeping said gas shut-off valve closed,
opening said gas shut-off valve, and
then setting said flow-rate setting command signal for a certain flow rate after said gas shut-off valve is opened; and generating plasma in said processing chamber filled with said processing gas.

8. The method of plasma processing according to claim 7, wherein the flow-rate setting command signal is set for zero flow while keeping said flow control valve in its closed position.

* * * * *